US007108516B2

(12) United States Patent
Naitoh

(10) Patent No.: US 7,108,516 B2
(45) Date of Patent: Sep. 19, 2006

(54) FLEXIBLE BOARD, CONNECTION METHOD THEREOF, AND CONNECTION STRUCTURE THEREOF

(75) Inventor: Katsuyuki Naitoh, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/041,982

(22) Filed: Jan. 26, 2005

(65) Prior Publication Data

US 2005/0161776 A1 Jul. 28, 2005

(30) Foreign Application Priority Data

Jan. 28, 2004 (JP) ............................ 2004-019855

(51) Int. Cl.
*H01R 12/00* (2006.01)

(52) U.S. Cl. ........................................................ 439/67

(58) Field of Classification Search .................. 439/67, 439/77, 495, 496
See application file for complete search history.

(56) References Cited

U.S. PATENT DOCUMENTS

| | | | | |
|---|---|---|---|---|
| 3,573,345 | A * | 4/1971 | Devries et al. | 174/254 |
| 3,633,189 | A * | 1/1972 | Billawala | 360/245.8 |
| 4,902,236 | A * | 2/1990 | Hasircoglu | 439/77 |
| 5,001,308 | A * | 3/1991 | Mori | 200/5 A |
| 5,383,788 | A * | 1/1995 | Spencer | 439/67 |
| 6,039,600 | A * | 3/2000 | Etters et al. | 439/496 |
| 6,558,186 | B1 * | 5/2003 | LePottier et al. | 439/496 |

FOREIGN PATENT DOCUMENTS

| | | |
|---|---|---|
| JP | 50-119954 | 9/1975 |
| JP | 2-73080 | 6/1990 |
| JP | 5-46033 | 6/1993 |
| JP | 5-57866 | 7/1993 |
| JP | 2001-119120 | 4/2001 |
| JP | 2001-332818 | 11/2001 |

OTHER PUBLICATIONS

Japanese Office Action dated Jan. 31, 2006 (w/English translation).

* cited by examiner

*Primary Examiner*—Phuong Dinh
(74) *Attorney, Agent, or Firm*—Nixon & Vanderhye P.C.

(57) ABSTRACT

The flexible board of the present invention is formed so that a bent portion is formed by bending the film edge side of the connection terminal of an input outer lead formed on the surface of a film that has flexibility. A connection portion constructed of a portion corresponding to the connection terminal of the film and the bent portion is inserted in a recess portion of a connector provided for a main body circuit board. A stopper inside the recess portion pressurizes the bent portion, and the connection terminal of the input outer lead is connected to an electrode terminal via the bent portion and the portion of the film. By merely forming the bent portion at the film, the connection portion of the flexible board that conforms to the connector of a prescribed standard of ZIF or the like can be formed simply and inexpensively.

6 Claims, 3 Drawing Sheets

2
7
6
1
4
1a
1b
3
5
B 11
10
9
1
6
1a
12
1b 8
8
1
6
9
12
10
11

2
7
6
11
9
10
12
9
1
13
14
13
C
4
1a
5
1c
1b
D
3

FLEXIBLE BOARD, CONNECTION METHOD THEREOF, AND CONNECTION STRUCTURE THEREOF

CROSS-REFERENCE TO RELATED APPLICATIONS

This nonprovisional application claims priority under 35 U.S.C. §119 (a) on Patent Application No. 2004-019855 filed in Japan on Jan. 28, 2004, the entire contents of which are incorporated herein by reference.

BACKGROUND OF THE INVENTION

The present invention relates to a flexible board that includes a film having flexibility and to a connection method and a connection structure of the board.

As a flexible board for connecting, for example, an LCD panel with a main body circuit board of a portable telephone, there has conventionally been one as shown in FIG. 6.

The flexible board is provided with an LCD driver chip 110 for driving an LCD panel 115, the chip being mounted on a surface of a film 101 by a COF (chip on film) method. A sealing resin 112 is provided so as to bury a gap between the LCD driver chip 110 and the film 101. The LCD driver chip 110 is connected to an input outer lead 106 and an output outer lead 111 via inner leads 113 formed on the film 101. The input outer lead 106 is connected to a main body circuit board 102, while the output outer lead 111 is connected to the LCD panel 115. A solder resist 109 is provided on the surface of the film 101 so as to cover the input outer lead 106 and output outer lead 111 in the peripheral portions of the LCD driver chip 110.

Electroless plating of Sn (tin) is provided on the surface of the inner leads 113, and the LCD driver chip 110 and the inner leads 113 are connected together with an Au—Sn eutectic alloy formed by thermocompression bonding of Sn to an Au protruding electrode 114 of the LCD driver chip 110.

The output outer lead 111 is connected to a terminal electrode of the LCD panel 115 with an anisotropic conductive adhesive 116 in which metal particles are diffused in the resin in a film-like form. The metal particles of the anisotropic conductive adhesive 116 have a diameter of about 5 μm. By carrying out the thermocompression bonding of the output outer lead 111 of the flexible board to the LCD panel 115 with interposition of the anisotropic conductive adhesive 116, continuity between the output outer lead 111 and the terminal electrode is obtained, and insulation between the film 101 and the LCD panel 115 is secured.

The input outer lead 106 is connected to an electrode terminal 107 inside a connector 103 provided for the main body circuit board 102. The connector 103 has a slit 104 of a roughly bracket-shaped sectional configuration, and an end portion of the film 101 is inserted in the slit 104. Then, the input outer lead 106 is pressurized against the electrode terminal 107 from the lower surface side of the film 101 by means of a stopper 105 provided in the slit 104, electrically connecting the input outer lead 106 to the electrode terminal 107 and fixing the film 101 to the connector 103. The connector 103 of the type is called the ZIF (Zero Insertion Force) connector.

The film 101 normally used for the flexible board has a thickness much thinner than the dimension of the slit 104 of the connector (the thickness is, for example, 103 μm when UPILEX produced by Ube Industries, Ltd. is used), and therefore, the stopper 105 cannot fix the single body of the film 101. Therefore, a reinforcing plate 120 of a prescribed thickness is bonded to a surface opposite from the surface on which the input outer lead 106 is provided in the portion inserted in the slit 104 of the film 101. By pressurizing the reinforcing plate 120 by means of the stopper 105, the film 101 is firmly connected to the connector 103. Moreover, the mechanical strength of the flexible board is increased by the reinforcing plate 120, making it difficult to damage the flexible board when the board is thrust into or pulled out of the connector 103. With regard to the reinforcing plate of the kind, there is one disclosed in, for example, JP 2001-119120 A.

The reinforcing plate 120 is constructed of a PI (polyimide) piece and a thermosetting adhesive for bonding the PI piece to the film 101. The process of forming the reinforcing plate 120 on the film 101 is constituted of a thermocompression bonding process for temporarily bonding the PI piece onto the film 101 and a curing process for completely hardening the thermosetting adhesive.

The thickness of the flexible board in the portion inserted in the slit 104 of the connector is about 300 μm, which includes 175 μm of the PI piece, 35 μm of the thermosetting adhesive and 103 μm of the film 101. The thickness is required to be maintained without change from when the reinforcing plate 120 is formed. However, the thermosetting adhesive is roughly completely hardened by the curing, and therefore, the thickness of the adhesive is scarcely reduced with a lapse of time. Therefore, the reduction in the thickness of the reinforcing plate 120 is effectively prevented, and the flexible board is stably fixed to the connector 103.

As described above, by connecting the input outer lead 106 to the main body circuit board 102 by the connector 103 of simple insertion and withdrawal, labor saving can be achieved further than when the connection is achieved by ACF (anisotropic conductive film) or soldering in the assembling process of the portable telephone.

The conventional flexible board normally has an elongate form of the material of the film 101 in the manufacturing processes, and the length sometimes reaches about 40 m despite that the width of the material is about 70 mm. Therefore, in the process of mounting the LCD driver chip 110 or other processes, the material of the film 101 wound around a reel is to be fed to a chip mounting apparatus in a reel-to-reel system. Moreover, the formation process of the reinforcing plate 120 also needs to be carried out on the material of the film 101 on the reel. Therefore, an apparatus for continuously carrying out the bonding of the PI piece to the material of the film 101 or the like in a reel-to-reel manner is needed. Furthermore, an apparatus of a curing furnace, an oven or the like for completely hardening the thermosetting adhesive of the reinforcing plate 120 is needed.

As described above, the conventional flexible board, which needs the comparatively expensive apparatus for the formation of the reinforcing plate 120, therefore has a problem that the manufacturing cost is comparatively high and a further increase in the cost is caused by the running cost of the apparatus and the addition of an inspection process.

SUMMARY OF THE INVENTION

Accordingly, the object of the present invention is to provide a flexible board that conforms to the standard of, for example, ZIF and is able to be manufactured at low cost.

In order to achieve the above object, there is provided a flexible board comprising:

a film having flexibility;

wiring provided on the film; and a connection terminal that is provided on the film and serves to electrically connect the wiring to outside, wherein the film has a portion located on an edge side of the connection terminal, the portion serving as a bent portion bent with respect to the other portion of the film.

According to the construction, the film provided with the wiring and the connection terminal has the film portion located on the edge side of the connection terminal bent with respect to the other portion of the film and serving as the bent portion. A comparatively great thickness is obtained by the thickness of the bent portion and the thickness of the other portion of the film. Therefore, the bent portion and other portion of the film can provide a thickness that conforms to the connector of which the dimension is prescribed by, for example, a standard. With this arrangement, the flexible board is appropriately connected to the connector merely by forming the bent portion of the film. As a result, it is not necessary to separately form the reinforcing plate or the like other than the film dissimilarly to the conventional case. Therefore, the apparatus for forming the reinforcing plate or the like is unnecessary, and the manufacturing processes of the flexible board can be reduced, so that cost reduction can effectively be achieved.

It is also acceptable to mount a semiconductor chip or the like connected to the wiring on the film.

In one embodiment of the present invention, the film has a through hole, and the film is bent along the through hole, forming the bent portion.

According to the embodiment, the bent portion, of which the film can easily be bent along the through hole, can therefore be bent in an appropriate position. Therefore, a flexible board conforming to a prescribed standard can be manufactured with satisfactory manufacturing efficiency.

In one embodiment of the present invention, the bent portion is formed by bending the film in a plurality of portions.

According to the embodiment, by providing the bent portion by bending the film in a plurality of portions, the total thickness of the bent portion and the other portion of the film can be a thickness that conforms to a prescribed standard. Therefore, a flexible board, which can appropriately be connected to the connector that conforms to the prescribed standard, can be formed easily at low cost.

Also, there is provided a flexible board connection method comprising the steps of:

preparing a circuit board provided with a connector that has a recess portion and a connection terminal positioned in the recess portion, and the flexible board claimed in claim 1; and inserting the connection terminal and the bent portion of the flexible board into the recess portion of the connector and electrically connecting the connection terminal of the connector with the connection terminal of the flexible board.

According to the method, the connection terminal and the bent portion of the flexible board are inserted into the recess portion of the connector provided for the circuit board, and the connection terminal of the connector and the connection terminal of the flexible board are electrically connected with each other. The thickness of the portion of the flexible board inserted in the recess portion of the connector can easily be adjusted by the bent portion, and therefore, the flexible board can easily be connected to the connector of the circuit board more simply and less expensively than in the conventional case in which the reinforcing plate is employed.

Also, there is provided a flexible board connection structure comprising:

a circuit board provided with a connector that has a recess portion and a connection terminal positioned in the recess portion; and the above flexible board, wherein the connection terminal and the bent portion of the flexible board are inserted into the recess portion of the connector, and the connection terminal of the connector and the connection terminal of the flexible board are electrically connected with each other.

According to the construction, the connection terminal and the bent portion of the flexible board are inserted into the recess portion of the connector of the circuit board. In addition, the connection terminal of the connector and the connection terminal of the flexible board are electrically connected with each other. The thickness of the portion of the flexible board inserted in the recess portion of the connector can easily be adjusted by the bent portion, and therefore, the connection structure of the flexible board can be formed more simply and less expensively than in the conventional case.

As described above, the flexible board of the present invention has the film that has flexibility, the wiring formed on the film and the connection terminal that is provided on the film and serves to electrically connect the wiring to the outside, and the film portion located on the edge side of the connection terminal serves as the bent portion bent with respect to the other portion of the film. Therefore, a flexible board, which can be connected to the connector of a prescribed standard, can be formed simply at low cost without separately forming a reinforcing plate dissimilarly to the conventional case.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
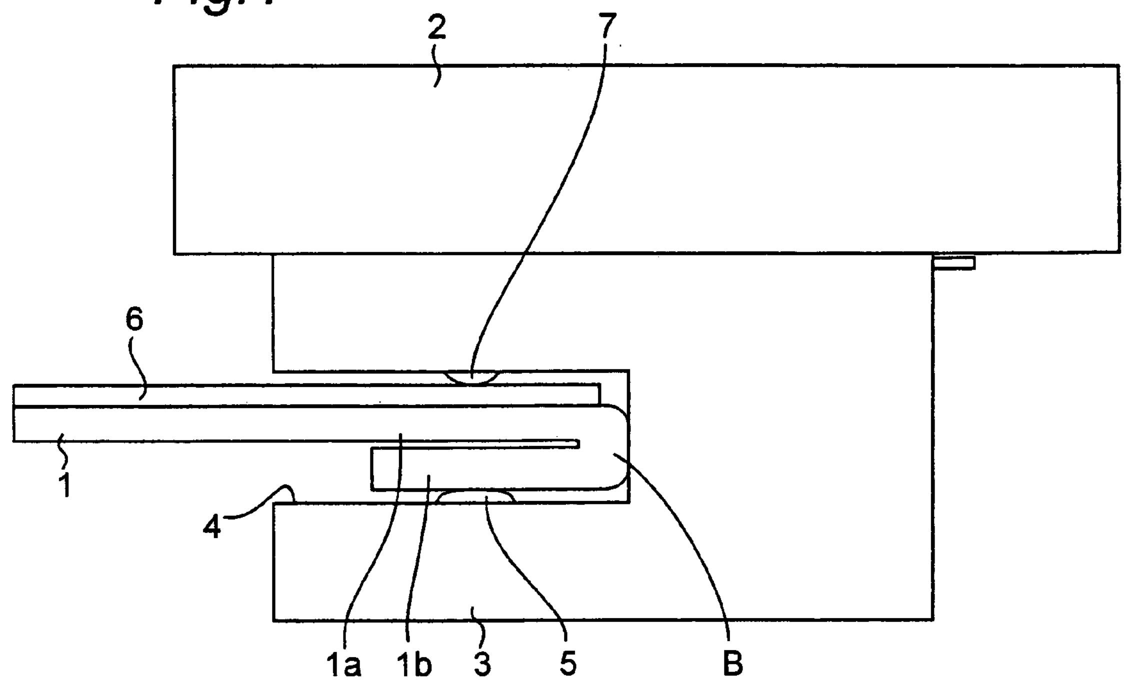
FIG. 1 is a sectional view showing the connection structure of a flexible board of a first embodiment of the present invention.

The present invention will be described in detail below on the basis of the embodiments shown in the drawings.

Figure 2:
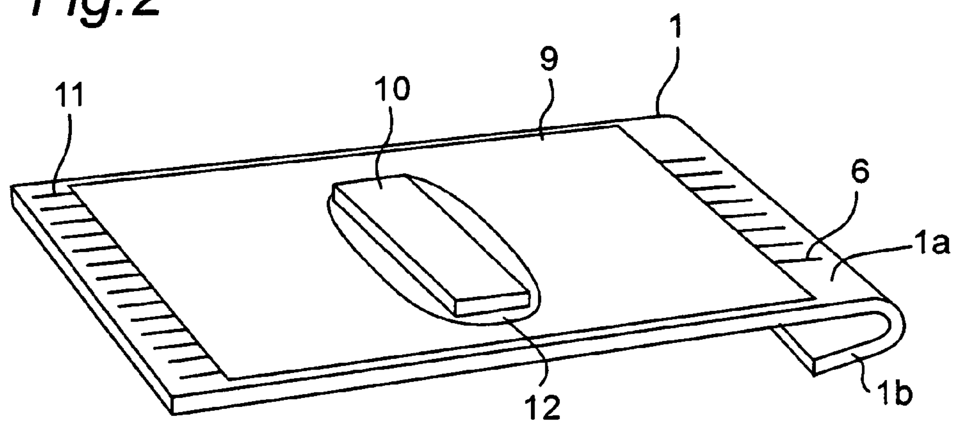
FIG. 2 is a perspective view showing the flexible board of FIG. 1.

FIG. 1 is a sectional view showing the flexible board of the first embodiment of the present invention and its connection structure. FIG. 2 is a perspective view showing the flexible board.

The flexible board of the present embodiment is used for a portable telephone and connects the LCD panel and the main body circuit board included in the portable telephone with each other. As shown in FIGS. 1 and 2, the flexible board includes a film 1 that is made of PI (polyimide) and has flexibility, an inner lead that serves as wiring (not shown) formed on the surface of the film 1, an input outer lead 6 that is connected to the inner lead and formed on the surface of the film 1 and an output outer lead 11 that is connected to the inner lead and formed on the surface of the film 1. The input outer lead 6 and the output outer lead 11 extend in mutually opposite directions with respect to the inner lead. The leading end portion of the input outer lead 6 and the leading end portion of the output outer lead 11 serve as connection terminals.

An LCD driver chip 10 for driving the LCD panel is mounted on the surface of the film 1, and an Au electrode formed on the lower surface of the LCD driver chip 10 and the inner lead of which the surface has undergone electroless plating of Sn are connected with each other with an Au—Sn eutectic alloy formed by thermocompression bonding. A solder resist 9 is arranged so as to partially cover the input outer lead 6 and the output outer lead 11 on the surface of the film 1 in the peripheral portions of the LCD driver chip 10. A sealing resin 12 is provided so as to bury a gap between the LCD driver chip 10 and the film 1, the input outer lead 6, the output outer lead 11 and the solder resist 9.

As shown in FIG. 1, a portion of the film 1 located adjacent to the connection terminal at the leading end of the input outer lead 6 is bent in a position B to form a bent portion 1*b*. The bent portion 1*b* and a film portion 1*a* where the connection terminal of the input outer lead 6 is positioned constitute a connection portion, and the connection portion is inserted into a recess portion 4 of the connector 3 provided for the main body circuit board 2. An electrode terminal 7 is provided on a surface located nearer to the circuit board 2 in the recess portion 4 of the connector 3, and the electrode terminal 7 and the connection terminal of the input outer lead 6 of the flexible board are brought in contact with each other. A stopper 5 is provided in a position facing the electrode terminal 7 in the recess portion 4 of the connector 3, and by pressurizing the film portion 1*a* with the stopper 5, the connection terminal of the input outer lead 6 is pressurized against the electrode terminal 7. With this arrangement, the connection terminal of the outer lead 6 and the electrode terminal 7 of the connector 3 are reliably connected with each other, and the flexible board 1 is firmly fixed to the connector 3.

The connector 3 is a ZIF connector, and the total thickness of the film portion 1*a* where the connection terminal of the outer lead is formed and the bent portion 1*b* has a thickness such that reliable fixation is achieved by the electrode terminal 7 and the stopper 5 of the connector 3. Therefore, the flexible board is not required to have a reinforcing plate formed on the film dissimilarly to the conventional case.

The flexible board of the above construction is manufactured as follows. That is, a PI tape, which is the material of the film 1, is fed to a wiring forming apparatus in a reel-to-reel system in a state in which the tape has a length of about 40 m and is wound around a reel. The PI tape, on which the inner and outer leads 6 and 11 are formed by the wiring forming apparatus, is withdrawn in a reel-to-reel system. Subsequently, the solder resist 9 is formed so as to partially cover the input outer lead 6 and the output outer lead 11. Thereafter, the LCD driver chip 10 is mounted on the surface of the PI tape. In detail, the electrode of the LCD driver chip 10 is connected with the inner lead by the formation of the Au—Sn eutectic alloy by thermocompression bonding, and the sealing resin 12, which buries the gap between the LCD driver chip 10 and the PI tape, is provided. Also, in the mounting apparatus of the LCD driver chip 10, the PI tape is fed and withdrawn in a reel-to-reel system. Finally, a punching process of the PI tape is carried out to complete the flexible board.

Figure 3:
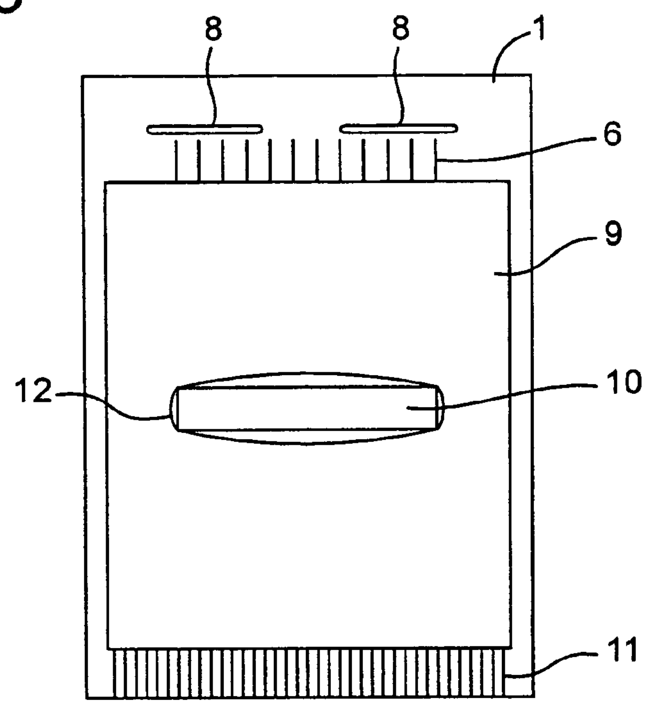
FIG. 3 is a plan view showing the flexible board punched out of a PI tape.

FIG. 3 is a plan view showing the flexible board punched out of the PI tape. Elongate through holes 8 and 8 are formed through the film 1 that constitutes the flexible board in the punching process. The through holes 8 and 8 are formed so that the lengthwise direction thereof is directed in the widthwise direction of the film 1. By bending the film 1 along the through holes 8 and 8, the portion of the film 1 located on the edge side of the through holes 8 and 8 becomes the bent portion 1*b*. In the connection structure of the flexible board of FIG. 1, the position B in which the film 1 is bent is located in the lengthwise direction position of the film 1 in which the through holes 8 are formed in FIG. 3.

The flexible board of the present embodiment is able to obtain the connection portion of which the thickness is approximately two times that of the film 1 and which is constructed of the film portion 1*a* where the connection terminal of the input outer lead 6 is located and the film bent portion 1*b* merely by bending the film 1 along the through holes 8. The thickness of the connection portion is a thickness that conforms to the connector 3 of the main body circuit board 2. Accordingly, the flexible board is not required to form a separate reinforcing plate on the film dissimilarly to the conventional case, and therefore, the manufacturing processes can be reduced further than in the conventional case. That is, the process and the machine for bonding the PI piece to the tape material in a reel-to-reel manner are unnecessary, and the apparatus of curing furnace, oven or the like for hardening the thermosetting adhesive of the reinforcing plate are unnecessary. Therefore, the flexible board of the present embodiment can be formed more easily and less expensively than in the conventional case. Moreover, the flexible board is able to form the through holes 8 in the punching process that is the indispensable process when the PI tape is used and to form the appropriate bent portion 1*b* easily with high accuracy by virtue of the through holes 8. Therefore, the flexible board that conforms to the connector can be formed at low cost through the necessary minimum number of processes.

Figure 4:
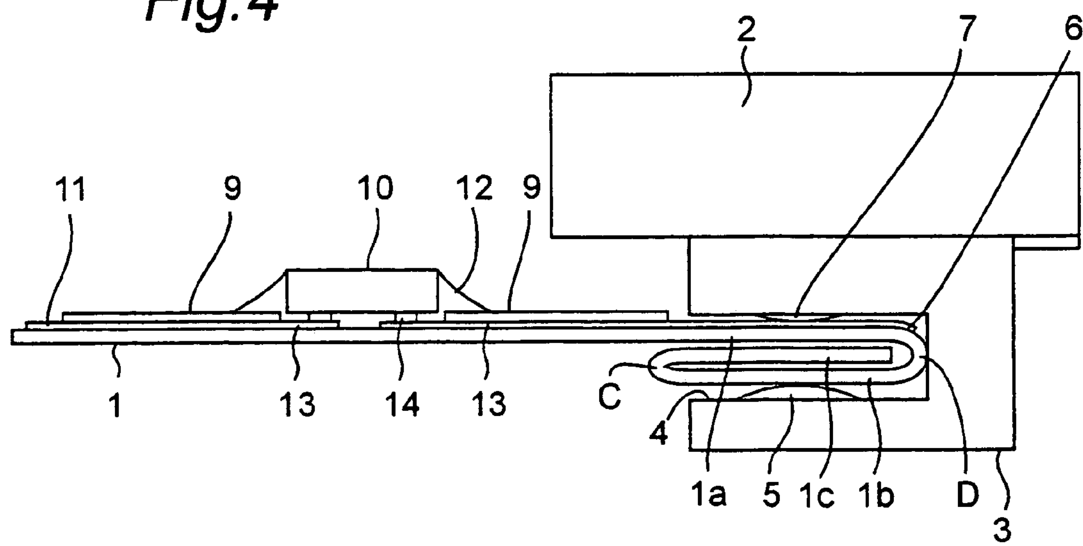
FIG. 4 is a sectional view showing a flexible board of a second embodiment and its connection structure.

FIG. 4 is a sectional view showing the flexible board of the second embodiment and its connection structure.

The flexible board of the second embodiment is similar to the first embodiment except that the constructions of bent portions 1*b* and 1*c* are varied. The same components as those of the first embodiment are denoted by same reference numerals, and no detailed description is provided therefor.

In the flexible board of the second embodiment, a connection portion of which the thickness is approximately three times that of the film 1 is formed by bending the film 1 in two portions of a position C and a position D. By thus forming the connection portion by bending the film 1 in two portions, a flexible board of which the film 1 has a comparatively small thickness can be made to simply conform to the connector 3 at low cost. FIG. 4 further shows an inner lead 13 and an Au protruding electrode 14.

It is acceptable to form through holes 8 and 8 as shown in FIG. 3 parallel in two lines in correspondence with the position C and the position D in which the film 1 is bent.

Figure 5:
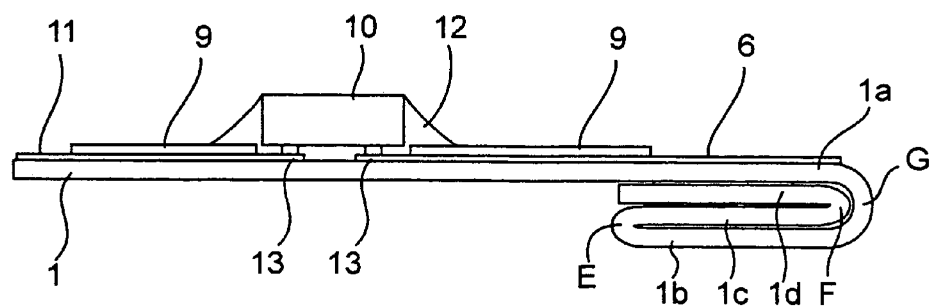
FIG. 5 is a view showing a flexible board of a third embodiment.
Figure 6:
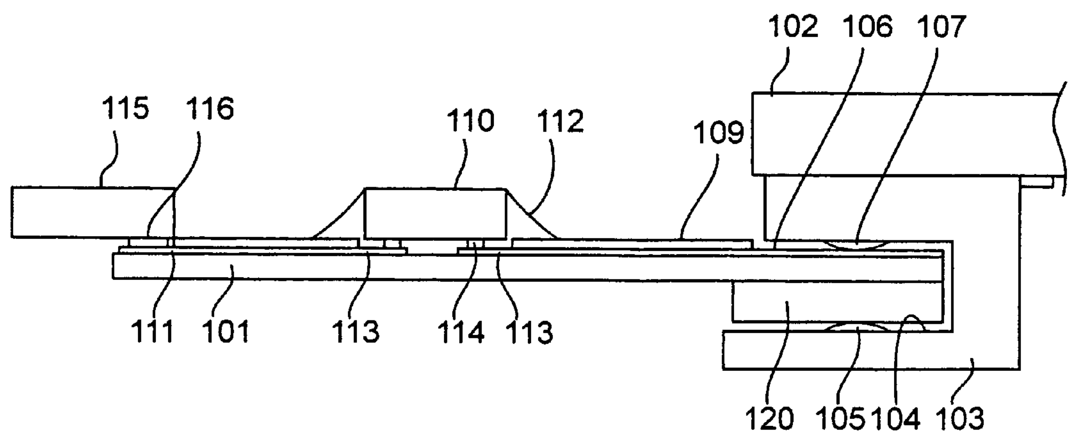
FIG. 6 is view showing a conventional flexible board.

FIG. 5 is a view showing the flexible board of the third embodiment. As shown in FIG. 5, the flexible board of the third embodiment is similar to the first embodiment except that the constructions of bent portions 1*b*, 1*c* and 1*d* are varied. The same components as those of the first embodiment are denoted by same reference numerals, and no detailed description is provided therefor.

In the flexible board of the third embodiment, a connection portion of which the thickness is approximately four times that of the film 1 is formed by bending the film 1 in three portions of a position E, a position F and a position G. By thus forming the connection portion by bending the film 1 in three portions, a flexible board of which the film 1 has a comparatively small thickness can be made to simply conform to the connector 3 at low cost.

As described above, the flexible board of the present invention can conform to different connectors merely by adjusting the number of portions in which the film is bent. Therefore, according to the present invention, a flexible board of high versatility can be obtained simply at low cost.

Although the bent portions 1*b*, 1*c* and 1*d* of the film 1 have been formed by bending the film along the through holes 8 in each of the above embodiments, it is acceptable to provide a cut portion or the like other than the through holes 8. Moreover, it is acceptable to provide neither through hole 8 nor the like.

Moreover, the film 1 may be formed of, for example, another material of polyester or the like other than PI so long as the film has flexibility.

Moreover, it is acceptable to mount a chip provided with another circuit unlimitedly to the LCD driver chip 10 on the film 1. Moreover, the chip need not be mounted.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A flexible board comprising:

a film having flexibility;

wiring provided on the film; and a connection terminal that is provided on the film and serves to electrically connect the wiring to outside, wherein the film has a portion located on an edge side of the connection terminal, the portion serving as a bent portion bent with respect to the other portion of the film so that the bent portion is bent underneath the other portion with no other structure being provided between the bent portion and the other portion in the area where the bent portion is bent underneath the other portion, and the film has at least one elongated through hole defined therein, the elongated through hole being formed so that the lengthwise direction thereof extends in the widthwise direction of the film, so that the film is bent along the through hole such that an axis along which the film is bent is approximately parallel to the lengthwise direction of the elongated through hole.

2. The flexible board as claimed in claim 1, wherein the bent portion is formed by bending the film in a plurality of portions.

3. A flexible board connection method comprising the steps of:

preparing a circuit board provided with a connector that has a recess portion and a connection terminal positioned in the recess portion, and the flexible board claimed in claim 1; and inserting the connection terminal and the bent portion of the flexible board into the recess portion of the connector and electrically connecting the connection terminal of the connector with the connection terminal of the flexible board.

4. A flexible board connection structure comprising:

a circuit board provided with a connector that has a recess portion and a connection terminal positioned in the recess portion; and the flexible board claimed in claim 1, wherein the connection terminal and the bent portion of the flexible board are inserted into the recess portion of the connector, and the connection terminal of the connector and the connection terminal of the flexible board are electrically connected with each other.

5. A flexible board electrically connecting a liquid crystal display panel and a circuit board, comprising:

a flexible film having flexibility, the film supporting a liquid crystal display driver chip and wiring in communication with the liquid crystal display driver chip;

a connection terminal that is provided on the film and serves to electrically connect the wiring to a connector for the circuit board, and wherein the flexible film has a portion located on an edge side of the connection terminal, the portion serving as a bent portion bent with respect to the other portion of the film so that the bent portion is bent underneath the other portion with no other structure being provided between the bent portion and the other portion in the area where the bent portion is bent underneath the other portion, wherein at least parts of the bent portion and the other portion of the film are inserted into a recess defined in the connector for the circuit board to make an electrical connection to the circuit board, and wherein the film has at least one elongated through hole defined therein, the elongated through hole being formed in a manner so that the film is bent along the through hole such that an axis along which the film is bent is approximately parallel to the lengthwise direction of the elongated through hole.

6. The flexible board of claim 5, wherein the bent portion is formed by bending the film in a plurality of portions.

* * * * *